(12) United States Patent
Padinger et al.

(10) Patent No.: US 11,417,782 B2
(45) Date of Patent: Aug. 16, 2022

(54) LAYERED STRUCTURE

(75) Inventors: Franz Padinger, St. Marien (AT); Klaus Schröter, Berlin (DE)

(73) Assignee: ASMAG—Holding GmbH, Gruenau im Almtal (AT)

( * ) Notice: Subject to any disclaimer, the term of this patent is extended or adjusted under 35 U.S.C. 154(b) by 655 days.

(21) Appl. No.: 12/517,884

(22) PCT Filed: Dec. 5, 2007

(86) PCT No.: PCT/AT2007/000548
§ 371 (c)(1),
(2), (4) Date: Dec. 13, 2010

(87) PCT Pub. No.: WO2008/067577
PCT Pub. Date: Jun. 12, 2008

(65) Prior Publication Data
US 2011/0073168 A1 Mar. 31, 2011

(30) Foreign Application Priority Data
Dec. 5, 2006 (AT) ................................ A 2018/2006

(51) Int. Cl.
*H01L 31/0224* (2006.01)

(52) U.S. Cl.
CPC ................ *H01L 31/022433* (2013.01); *H01L 2924/0002* (2013.01); *Y02E 10/50* (2013.01)

(58) Field of Classification Search
CPC ......... H01L 31/022433; H01L 2924/00; H01L 31/022441; H01L 31/02245; H01L 31/022458; H01L 2924/0002; Y02E 10/50
(Continued)

(56) References Cited

U.S. PATENT DOCUMENTS 3,278,811 A * 10/1966 Hiroshi ......................... 136/244
3,690,953 A *  9/1972 Wise ............................. 136/255
(Continued)

FOREIGN PATENT DOCUMENTS

DE   3814615   11/1988
DE   10231140   1/2004
(Continued)

OTHER PUBLICATIONS

Niggeman, M., et al. "Functional substrates for flexible organic solar cells", Proc. SPIE 5938, Organic Photovoltaics VI, 593802 (Oct. 3, 2005); doi: 10.1117/12.617196 (Year: 2005).*
(Continued)

*Primary Examiner* — Tamir Ayad
(74) *Attorney, Agent, or Firm* — Collard & Roe, P.C.

(57) ABSTRACT

The invention relates to a layered structure (1) with semiconducting materials on a support layer (3) comprising at least one planar semiconducting layer (6) and several electrodes, in particular a first (4) and second (5) one. The semiconducting layer (6) has a top (8) and bottom (7) flat face extending essentially parallel and spaced apart from one another by the height of the layer (10). The semiconducting layer (6) is also applied by the bottom flat face (7) to a flat face of the support layer (2) and the two electrodes are connected to the semiconducting layer in an electrically conducting manner. The at least two electrodes are applied by means of a structuring process and are disposed on two oppositely lying faces of the semiconducting layer and/or in planes at least approximately parallel between the two faces.

21 Claims, 2 Drawing Sheets

(58) Field of Classification Search
USPC ......... 136/252, 255; 257/183, 184, E31.002, 257/E29.068, E21.085
See application file for complete search history.

(56) References Cited

U.S. PATENT DOCUMENTS

| | | | | |
|---|---|---|---|---|
| 3,994,012 | A | * | 11/1976 | Warner, Jr. ....... H01L 31/03529 136/246 |
| 4,110,122 | A | * | 8/1978 | Kaplow ................ H01L 31/068 136/246 |
| 4,191,794 | A | * | 3/1980 | Shirland .............. H01L 31/046 136/249 |
| 4,383,129 | A | * | 5/1983 | Gupta ................... C08F 265/06 427/407.1 |
| 4,478,879 | A | * | 10/1984 | Baraona ............. H01L 21/2254 136/256 |
| 4,663,495 | A | * | 5/1987 | Berman ............ H01L 31/02167 114/201 R |
| 4,830,038 | A | * | 5/1989 | Anderson et al. ............ 136/251 |
| 4,839,714 | A | | 6/1989 | Doehler et al. |
| 4,918,507 | A | | 4/1990 | Yoshida |
| 5,073,520 | A | | 12/1991 | Yoshida |
| 5,584,940 | A | * | 12/1996 | Yoshida ........................ 136/251 |
| 5,797,998 | A | * | 8/1998 | Wenham ......... H01L 31/022425 136/255 |
| 6,046,403 | A | * | 4/2000 | Yoshikawa ........... H01L 31/048 136/256 |
| 6,191,465 | B1 | | 2/2001 | Freeouf |
| 6,194,651 | B1 | | 2/2001 | Stark et al. |
| 6,812,399 | B2 | * | 11/2004 | Shaheen et al. .............. 136/263 |
| 2002/0066478 | A1 | * | 6/2002 | Hayashi .............. H01L 31/0236 136/244 |
| 2005/0045874 | A1 | * | 3/2005 | Xiao .................... H01L 51/0575 257/40 |
| 2006/0231130 | A1 | | 10/2006 | Sharps et al. |
| 2008/0000518 | A1 | * | 1/2008 | Basol .................... H01L 31/048 136/247 |
| 2008/0035198 | A1 | | 2/2008 | Teppe et al. |

FOREIGN PATENT DOCUMENTS

| | | |
|---|---|---|
| DE | 102004050269 | 4/2006 |
| EP | 1715529 | 10/2006 |
| WO | 9938217 | 7/1999 |
| WO | 2004008553 | 1/2004 |

OTHER PUBLICATIONS

Suemori, Kouji et al., "Vertical Junction Type Organic Photovoltaic Cells", Japan Journal of Applied Physics, vol. 43, No. 8B, pp. 1094-1096. (Year: 2004).*

Suemori, Kouji et al., "Vertical Junction Type Organic Photovoltaic Cells", Japanese Journal of Applied Physics, vol. 43, No. 8B, pp. L1094-L1096. (Year: 2004).*

International Search Report, PCT/AT2007/000548, dated Apr. 22, 2008.

* cited by examiner

LAYERED STRUCTURE

CROSS REFERENCE TO RELATED APPLICATIONS

The present application is a national phase entry under 35 U.S.C. § 371 of International Application No. PCT/AT2007/000548, filed on Dec. 5, 2007, published in German, which claims the benefit of Austrian Patent Application No. A 2018/2006, filed Dec. 5, 2006. The disclosures of said applications are incorporated by reference herein.

BACKGROUND OF THE INVENTION

1. Field of the Invention

The invention relates to a layered structure with semiconducting materials on a support layer, which comprises at least one planar semiconducting layer and several electrodes, in particular a first and a second one, and the semiconducting layer has a top and bottom flat face extending essentially parallel with one another and spaced apart from one another by the height of the layer, and the semiconducting layer is applied by the bottom flat face to a flat face of the support layer, and the two electrodes are connected to the semiconducting layer in an electrically conducting manner, as well as a method of producing the latter. The invention further relates to a solar cell for releasing charge carriers due to the action of an electromagnetic wave, in particular light, and a transistor.

2. Description of the Related Art

Charge carriers released from a planar semiconducting layer are preferably dissipated by means of electrically conducting electrodes applied to the flat faces of the layer.

Semiconducting components are usually built up in layers and the planar semiconducting layers are preferably disposed one on top of the other. The electrons from the semiconducting layers of such a layered structure are dissipated via electrically conducting electrodes, which are preferably disposed between the layers. Additional intermediate layers may be necessary under certain circumstances, for example electrically isolating layers. To obtain the most efficient dissipation possible of the charge carriers from the semiconducting material, these electrodes should be made from a material which is a very good electrical conductor.

If the semiconducting layer is made from a photoactive material, for example, precautions need to be taken to ensure that the electrodes do not obstruct the optical path of the incident light too greatly. The electrodes and in particular those facing the light source must therefore be transparent or semi-transparent, at least in the part of the spectrum of the incident light in which the semiconducting layer is photoactive. The disadvantage of this is that transparent and semi-transparent electrodes are preferably made from a metal oxide but this has a much worse electrical conducting capacity than a metal conductor. In a layered structure made up of several semiconducting layers, therefore, several transparent or semi-transparent electrodes are disposed one after the other in the optical path of the incident light. Since each of these electrodes absorbs a part of the incident light, the number of layers which can be disposed one above the other in this manner is limited because the light is weakened to such a high degree once it has passed through several electrodes that the energy is no longer sufficient to release charge carriers in the photoactive layer.

SUMMARY OF THE INVENTION

The objective of the invention is to propose charge carriers which are released from at least one semiconducting layer due to an active effect via very good electrically conducting electrodes from the layer, and none of the electrodes must be disposed in the direction in which the effect releasing the charge carriers acts.

The objective of the invention is achieved, independently in each case, due to the fact that
  the at least two electrodes are disposed on two oppositely lying faces of the semiconducting layer and/or in planes extending at least approximately parallel between the two faces;
  the solar cell and the transistor have a layered structure as proposed by the invention.

The fact that the least two electrodes are disposed on two oppositely lying faces of the semiconducting layer and/or between the two faces in planes at least approximately parallel with it ensures that no electrode is disposed in the direction of an effect which releases charge carriers, for example an electromagnetic wave. The particular advantage of the claimed layered structure is that the entire flat face of the semiconducting layer is available as an active surface.

If the support layer, semiconducting layer and electrodes are flexible and elastically deformable and reboundable, the layered structure proposed by the invention offers the particular advantage that it can be applied to non-flat support surfaces. In particular, this also makes it conceivable to use it in devices of the type where the support surface can be subjected to high impacts or dynamic deformation. For example, the layered structure can therefore also be applied to devices designed for mobile applications during which impacts, vibrations and mechanical deformation are likely. In another advantageous embodiment, the claimed layered structure can also be applied to textiles, for example.

If the support layer is transparent, it is possible for an effect releasing charge carriers to act from the direction of the bottom flat face of the semiconducting layer. The major advantage of this is that the claimed layered structure has two preferred directions for the action of an effect which releases charge carriers. This is of particular advantage if, for reasons due to mounting, the layered structure with the support layer were disposed in the direction of the effect releasing charge carriers and the semiconducting layers were therefore facing away from the direction in which the effect acts.

If the support layer is made from an electrically non-conducting material, it is possible to apply the electrodes and the semiconducting layer directly onto the support layer. The advantage of this is that no additional separating layer is needed, in particular an isolating layer.

If the semiconducting material is selected from a group comprising photoactive materials, organic and inorganic semiconducting materials, the claimed layered structure can be used to obtain a release of charge carriers by more than one active effect. For example, a design incorporating photoactive materials enables a solar cell to be obtained—in which case the active effect would be a partial range of the sunlight. However, it would also be conceivable for the semiconducting layer to react to high-frequency electromagnetic waves, in which case charge carriers will be released due to the impact of a wave with the corresponding frequency. It would also be possible to use combinations of organic and inorganic materials and the range of materials which can be used is very broad and includes, for example, polymers, small molecules, dendrimers, quantum dots, inorganic nano-particles as well as carbon nano-tubes. A photoactive layer may consist of an individual component or at least two components (donor, acceptor). A more efficient charge separation can be obtained by mixing the polymer with acceptor-type materials, for example inorganic nano-particles, because the boundary surface between the two components is distributed across the entire absorber volume—referred to as a bulk-heterojunction.

If at least one other layer, preferably made from a different semiconducting material, is applied to the semiconducting layer, complex semiconducting components can be built. A claimed design with organic and inorganic material enables sensors or transistors to be built. Semiconducting components such as transistors are usually made up of several layers of different semiconducting materials applied one on top of the other and overlapping with one another in at least certain regions. Precisely those effects which result in the behavior of a transistor then occur at the transitions between the layers. The layered structure also enables the properties of the individual layers to be advantageously combined so that a component can be obtained which is optimized for a broader range of or several possible active effects. For example, the layers can be optimized so that every layer has a particularly high degree of absorption in a partial range of the sunlight. This will then result in a solar cell which has a high degree of absorption in a broad spectral range of the sunlight and hence a high degree of efficiency.

If the photoactive material is designed to absorb a part-range of the light spectrum, in particular sunlight, charge carriers will be released within the layer under the effect of solar radiation. A photoactive material can then be optimized so that it has a particularly high absorption rate in a part-range and therefore releases a particularly large amount of charge carriers. Releasing a large amount of charge carriers in turn means a high capacity to deliver current and hence a higher degree of efficiency. In particular, it is technically simpler to optimize the absorption rate of a photoactive semiconducting layer for a narrow spectral range than a high absorption rate across a broader spectral range.

If the photoactive material is transparent for the non-absorbed part-range of the light spectrum, in particular sunlight, those spectral elements for which the semiconducting layer is not photoactive are able to pass through the layer largely unobstructed. The significant advantage of this is that the energy of the non-photoactively used spectral elements is largely preserved.

Due to the fact that every photoactive layer applied absorbs a different part-range of the light spectrum, in particular sunlight, it is advantageously possible to make use of several spectral ranges of the light. If individual photoactive layers which are optimized for a high absorption in a part-range of the light are layered one on top of the other as claimed, a part-range of the light spectrum is absorbed as the light passes through the uppermost photoactive layers, and the non-absorbed elements of the light spectrum pass through largely unaffected. The at least one other layer applied then uses a predominantly different spectral range to generate energy, even though the photoactive spectral ranges of the layers may at least partially overlap. Over-all, a decisive advantage is gained in that with the claimed layered structure, a significant increase can be obtained in the degree of efficiency. By contrast with layered structures known to date, the claimed layered structure enables significantly more semiconducting layers to be disposed one on top of the other because no transparent or semi-transparent electrodes are needed between the semiconducting layers. The main advantage of this is that by reference to a unit of surface area of the support layer, the number of charge carriers released and hence the current delivered is significantly higher than is the case with layered structures known to date.

Applying the electrodes to the full surfaces of the side faces of the semiconducting layer in an electrically conducting manner enables the best possible delivery of charge carriers because with this design, the electrical transition resistance between the semiconducting layer and electrode is at its lowest. In addition to applying an electrode over a full surface, yet other electrode designs are also possible. For example, the electrodes may be applied in a lattice or striped pattern and/or in only certain discrete portions. It would also be conceivable to opt for a porous electrode, for example a sintered electrode.

In the case of semiconducting materials, released charge carriers can be mutually extinguished due to recombination. This effect is all the more pronounced the farther away from each other the electrodes are positioned, i.e. the thicker the semiconducting layer between the electrodes is or the less efficiently the electrons released from the semiconducting layer are drawn away. Due to the fact that the first and second electrodes are each made from a different metal with a different electron work function, the internal quantum efficiency of the respective layer can be increased because fewer released charge carriers are lost due to recombination. The claimed design advantageously results in an increase in the degree of efficiency of the component as a whole.

If all of the first and second electrodes are connected to one another respectively in an electrically conducting manner, an electric parallel circuit of all the layered structures disposed on the support layer can be obtained. The main advantage of this claimed embodiment resides in the fact that no space on the support layer is lost to providing an electrically conducting connection of the individual electrodes, as a result of which significantly more semiconducting surface is available for releasing charge carriers, which in turn increases the degree of efficiency.

If the electrodes are designed as mutually interlocking finger electrodes, a particularly advantageous space-saving arrangement of the electrodes and semiconducting layer can be obtained. One claimed embodiment has an additional advantage in that the electrodes can be disposed so that a layer of semiconducting material of uniform width can be applied parallel with the flat face of the support layer. This largely avoids local concentrations of released charge carriers and prevents current from being applied to the electrodes in a non-uniform manner.

The objective proposed by the invention is also achieved by a method of producing a layered structure with semiconducting materials on a support layer, and the at least two electrodes are disposed on two oppositely lying faces of the semiconducting layer and/or in planes at least approximately parallel with it between the two faces.

The layered structure proposed by the invention uses a semiconducting effect which occurs when a semiconducting layer is disposed between two different metal materials. If, as claimed, first and second electrodes are applied in an alternating arrangement and spaced at a distance apart from one another, the layered structure proposed by the invention can be applied to the support layer in a particularly space-saving arrangement. Another major advantage is that methods which might otherwise damage an existing semiconducting layer can be used to apply the electrodes.

Due to the fact that the electrodes can be applied to the support layer by means of a structuring process, for example lithography, screen printing, inkjet, nano-imprint, stamping, laser ablation (in this instance a surface coating will be needed beforehand, for example by vapor deposition), the electrodes can be manufactured inexpensively.

Another advantage of these methods is that they do not require any complex and hence expensive equipment such as a high-vacuum chamber. These methods are also suitable for producing the layered system proposed by the invention on a continuous basis.

Applying the two electrodes in the form of interlocking finger electrodes offers several significant advantages. The fact that the electrodes interlock means that optimum use is made of the space on the support layer because no space is lost for electrically conducting connecting wires between the electrodes or for means to isolate the electrodes from one another. The finger electrodes can also advantageously be designed so that the width of the semiconducting layer between the two electrodes parallel with the support layer is largely constant, thereby avoiding any local increase in charge carrier densities. Due to the recombination effects, the width of the layer between the electrodes should be as thin as possible, as a result of which all electrode designs which permit the best possible dissipation of the released charge carriers would be conceivable.

A major advantage is obtained by one claimed embodiment in which the semiconducting layer is applied to the full surface so that the semiconducting layer is applied both on top of the support layer and on top of the previously applied electrodes. Since the electrodes are already applied to the support layer beforehand, the semiconducting material is also deposited on their top flat face but this does not impair dissipation of the released charge carriers. Accordingly, there is advantageously no need to dispose the semiconducting layer away from the electrodes or to prevent it from getting onto the electrodes when applying the semiconducting layer. This enables the use of surface printing methods such as, for example, doctor blade, screen printing, engraving, intaglio printing, flexographic printing, dip coating and spray coating.

The advantage of using a method from the group comprising vapor deposition and surface printing methods (for example rod doctor, screen printing, engraving, intaglio printing, flexographic printing, dip coating, spray coating) as a means of applying the semiconducting layer is that these methods enable the layered structure to be produced easily and inexpensively. These methods have a particular advantage in that they do not require any complex and hence expensive equipment, such as a high vacuum chamber for example. These methods are also suitable as a means of producing the layered system proposed by the invention on a continuous basis.

The advantage of applying the semiconducting layer in a structured arrangement is that specific structures can be obtained, for example as a means of improving the degree of efficiency or enhancing the mobility of the charge carriers. One particular claimed option is to apply no semiconducting layer in specifically selected areas in order to leave space available or to provide an electrical connection. It is also possible to create semiconducting structures perpendicular to the plane of the support layer.

Using a method from the group comprising inkjet printing, screen printing and laser ablation also has an advantage in that no complex and hence expensive equipment is needed and the layered system proposed by the invention can be produced as part of a continuous process.

If an electric field is applied whilst the semiconducting layer is being applied, the orientation of the molecules in the semiconducting layer can be influenced. The main advantage of this embodiment is that it enables the conductivity of the semiconducting layer to be increased. This is of particular importance in that it enables the recombination effects mentioned above to be reduced as a result of the higher conductivity of the semiconducting layer. A field strength of $10^{-5}$V/cm corresponds to 1V/100 nm layer thickness.

By opting for an appropriate material combination, a higher quantum efficiency of the semiconducting layer can be achieved, the main advantage of which is that charge carriers are released even at a lower intensity of the active effect. This again increases the degree of efficiency of the layered structure proposed by the invention.

If at least one other layer, preferably of a different semiconducting material, is applied to the top flat face of the semiconducting layer, a particularly space-saving layered structure can be obtained. Semiconducting layers can be optimized for different applications. For example, if the semiconducting layers are of a photoactive type and every layer is optimized for a specific spectral range of the incident light, a solar cell of the claimed type can be created which makes use of significantly more spectral elements in order to generate energy than currently known solar cells. The particular advantage obtained as a result of the claimed arrangement is that by adding another semiconducting layer, the number of charge carriers released per unit of surface area of the support layer can be increased.

In the case of all the solar cells known to date, the charge carriers released from the semiconducting layers are dissipated due to the fact that a transparent or semi-transparent electrode is applied between each of the semiconducting layers. As described above, transparent and semi-transparent electrodes have a significantly lower conductivity than metal materials. However, a solar cell of the claimed type does not have any electrodes in the optical path of the incident light. This being the case, several photoactive layers can be disposed one on top of the other, which increases the degree of efficiency on the one hand and makes better use of the space available on the surface of the support layer on the other hand. The main advantage of a solar cell based on the claimed design is that it results in a much higher energy density.

Transistors usually have a layered structure, the problem of which is that released charge carriers are transported away from the semiconducting layers. The layered structure proposed by the invention lends itself particularly well to components of this type. By disposing the electrodes on the side faces of the semiconducting layers, the components can be produced to a more compact and hence economical design.

BRIEF DESCRIPTION OF THE DRAWINGS

The invention will be explained in more detail below with reference to examples of embodiments illustrated in the appended drawings.

These provide schematically simplified diagrams as follows.

DETAILED DESCRIPTION OF THE PREFERRED EMBODIMENTS

Firstly, it should be pointed out that the same parts described in the different embodiments are denoted by the same reference numbers and the same component names and the disclosures made throughout the description can be transposed in terms of meaning to same parts bearing the same reference numbers or same component names. Furthermore, the positions chosen for the purposes of the description, such as top, bottom, side, etc., relate to the drawing specifically being described and can be transposed in terms of meaning to a new position when another position is being described. Individual features or combinations of features from the different embodiments illustrated and described may be construed as independent inventive solutions or solutions proposed by the invention in their own right.

Figure 1:
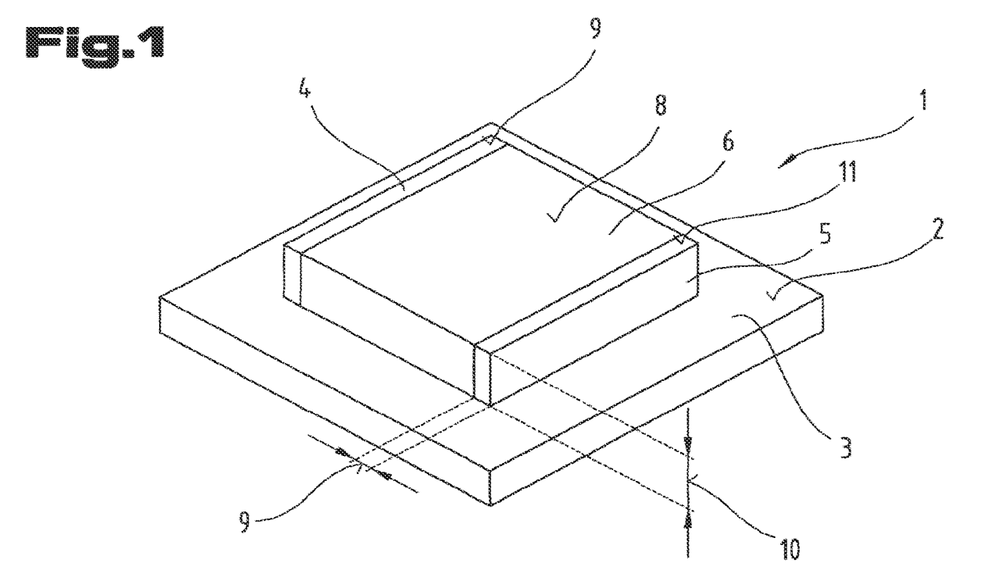
FIG. 1 is a perspective view of a layered structure.

FIG. 1 illustrates a layered structure 1 applied to a flat face 2 of the support layer 3 and incorporating a first 4 and second 5 electrode. Disposed between the two electrodes is a semiconducting layer 6, which has a bottom 7 and top 8 flat face. The support layer 3 of the resultant layered structure 1 proposed by the invention is made from an electrically non-conducting plastic, for example. In one advantageous embodiment, this plastic may be transparent and/or flexible and elastically deformable. Another possible option is a film-type design. However, the layered structure 1 proposed by the invention is not affixed to plastics serving as a support layer and instead, essentially all predominantly flat support layers may be used.

A first 4 and second 5 electrically conducting electrode are applied to the flat face 2 of the support layer by means of a structuring process, for example lithography, screen printing, etc. The main advantage of the layered structure proposed by the invention is that the electrodes are made from electrically, very efficiently conducting metal materials. For example, the first electrode is made from aluminium aluminum (Al) and the second electrode is made from copper (Cu) or gold (Au). The electrodes have a small base surface and in particular, the ratio of the thickness 9 to the height 10 of the electrodes is less than 1. Once the electrodes have been applied, the semiconducting layer 6 is applied across the full surface on top of the support layer and on top of the electrodes by means of a method from the group comprising vapor deposition, surface printing (for example rod doctor, screen printing, engraving, intaglio printing, flexographic printing, dip coating, spray coating). For the function of the layered structure, it is irrelevant that the semiconducting layer is also deposited on the top flat face 11 of the electrodes. If the support layer is made from an electrically conducting material for example, an electrically isolating intermediate layer must be applied to the flat face 2 of the support layer prior to applying the electrodes and semiconducting layer in order to prevent short-circuiting of the electrodes. One advantageous embodiment of an electrically conducting support layer might be one where the protective layer is applied in a structured arrangement, and the portion where the first electrode will subsequently be applied is left free for example. The first and second electrodes are then applied, the first electrode is connected directly to the electrically conducting support layer and the current is then fed onwards directly via the electrically conducting support layer.

Figure 2:
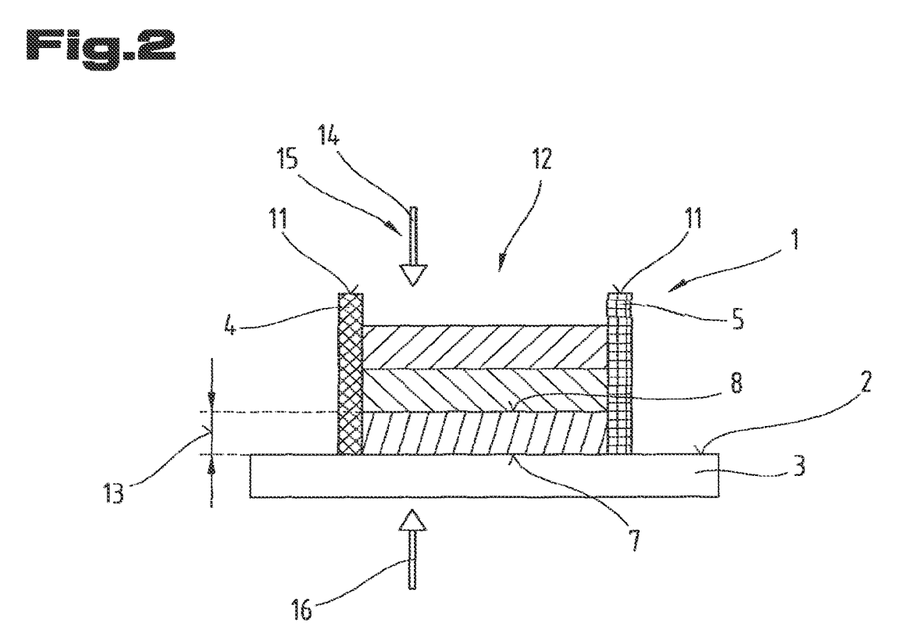
FIG. 2 shows a layered structure with several layers.

In the case of the layered structure 1 illustrated in FIG. 2, a first 4 and second 5 electrode are applied directly onto the support layer 3. Disposed one on top of the other between the two electrodes are three semiconducting layers 12 in total, and each layer has a bottom 7 and a top 8 flat face as well as a thickness 13. The individual layers are made from polymers, carbon nano-tubes, small molecules, dendrimers, quantum dots, inorganic nano-particles and mixtures thereof for example, and may be applied in several work steps one after the other, in particular by means of a continuous or printing process, for example, thereby offering advantages. Since the electrodes are applied laterally on the semiconducting layers, the active effect 14 is able to reach all the layers one on top of the other unhindered. If the support layer is advantageously of a transparent design, it will also be possible, in addition to an effect acting from a top 15, to obtain an effect releasing charge carriers from the bottom face 16 of the support layer.

Figure 3:
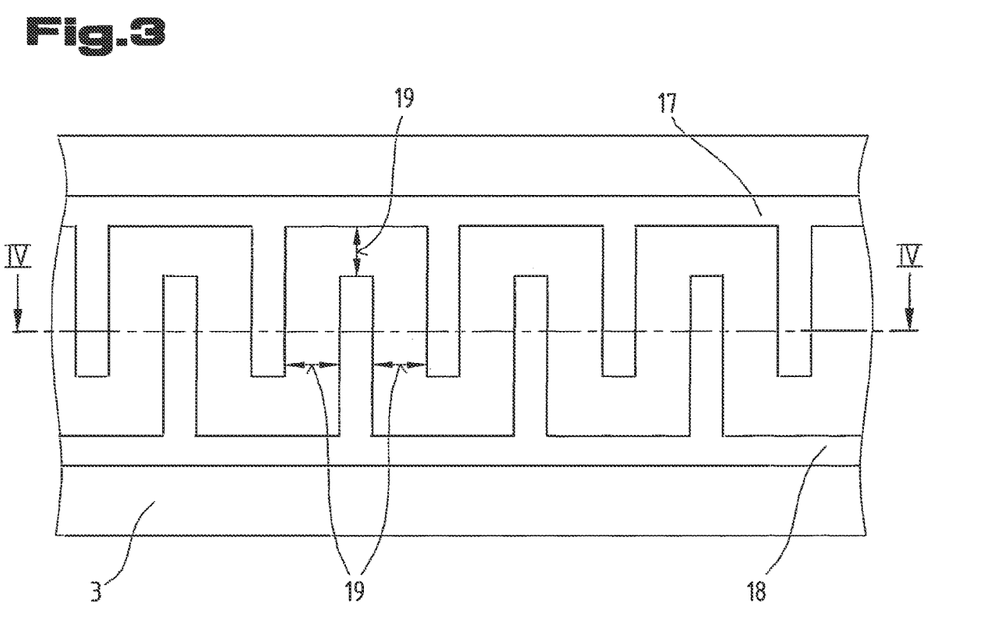
FIG. 3 is a plan view of a layered structure with finger electrodes.

FIG. 3 illustrates a layered structure 1 in which the electrodes are provided in the form of first 17 and second 18 mutually interlocking finger electrodes spaced apart from one another by the distance 19. As a result of this arrangement, a continuous width 19 of the semiconducting layer can be obtained between the first and second finger electrodes. In other advantageous embodiments, however, other electrode shapes would also be conceivable with a view to ensuring good dissipation of the charge carriers released from the at least one semiconducting layer. For example, star-shaped electrodes might be used or mutually interlocking triangular electrodes. The mutually interlocking arrangement of the electrodes makes the best possible use of the space available on the support layer.

Figure 4:
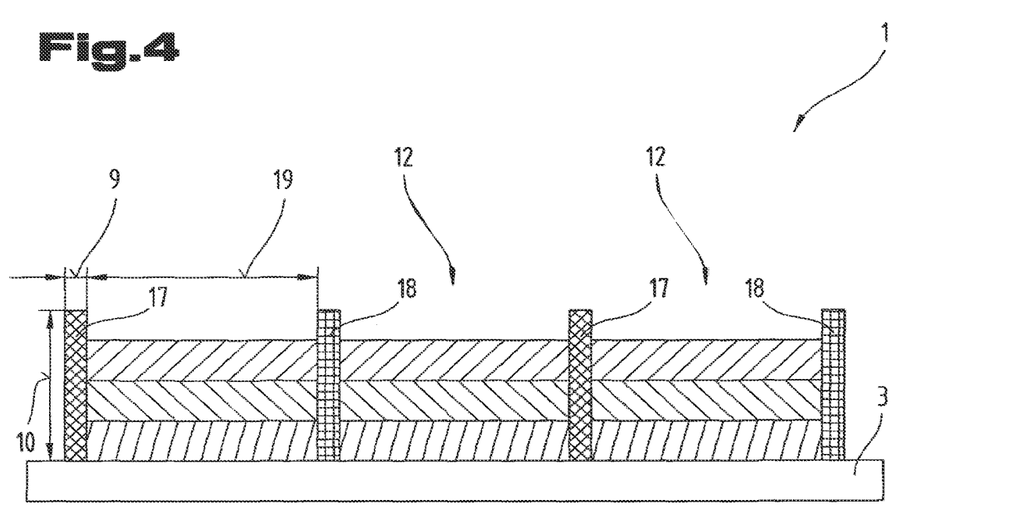
FIG. 4 is a section through the layered structure illustrated in FIG. 3, although not to scale.

FIG. 4 illustrates the section taken from FIG. 3, although not to scale. The first 17 and second 18 finger electrodes are disposed in an alternating arrangement and spaced apart from one another by the layer 19 on the support layer, and every electrode has a height 10 and a thickness 9. A semiconducting layer is then applied to the support layer and to the previously applied electrodes in a layered arrangement 12 in each case.

The layered structure proposed by the invention may be applied to textiles, for example. A solar cell of the claimed design is used as an energy source and the functional logic is provided in the form of a component unit made up of the claimed transistors. For example, it would be conceivable to produce an item of sports clothing which monitors physiological parameters during training and emits an alarm when threshold values are reached.

To avoid unnecessary repetition, reference may be made to the explanations given above for details of other embodiments and to the claims for variants of the different embodiments.

For the sake of good order, finally, it should be pointed out that, in order to provide a clearer understanding of the structure of the device 1, it and its constituent parts are illustrated to a certain extent out of scale and/or on an enlarged scale and/or on a reduced scale.

The objective underlying the independent inventive solutions may be found in the description.

Above all, the individual embodiments of the subject matter illustrated in FIGS. 1 and 2 constitute independent solutions proposed by the invention in their own right. The objectives and associated solutions proposed by the invention may be found in the detailed descriptions of these drawings.

LIST OF REFERENCE NUMBERS

1 Layered structure
2 Flat face of the support layer

3 Support layer
4 First electrode
5 Second electrode
6 Semiconducting layer
7 Bottom flat face
8 Top flat face
9 Thickness
10 Height
11 Top flat face of the electrode
12 Semiconducting layer
13 Thickness
14 Effect releasing charge carriers
15 Effect acting from the top
16 Effect acting from the bottom
17 First finger electrode
18 Second finger electrode
Distance

The invention claimed is:

1. A solar cell for releasing charge carriers due to the effect of an electromagnetic wave, wherein the solar cell has a layered structure comprising:
   a support layer having a top flat face and a bottom flat face;
   a first electrode and a second electrode; and
   a first planar semiconducting layer having a top flat face, a bottom flat face, and first and second flat side faces having first and second full surface areas, respectively, wherein the top flat face and the bottom flat face of the first planar semiconducting layer extend essentially parallel with one another and are spaced apart from one another by a height of the first planar semiconducting layer;
   a second planar semiconducting layer having a top flat face, a bottom flat face, and first and second flat side faces having first and second full surface areas, respectively, wherein the top flat face and the bottom flat face of the second planar semiconducting layer extend essentially parallel with one another and are spaced apart from one another by a height of the second planar semiconducting layer;
   wherein the support layer forms a base for the installation of the first electrode and the second electrode applied by a structuring process directly on the top flat face of the support layer, the support layer carrying the first electrode and the second electrode;
   wherein the first and second electrodes each have a rectangular cross section with a width and a height, such that only a flat face of the first and second electrodes corresponding to the width of the first and second electrodes is arranged directly onto the support layer;
   wherein each height of the electrodes extends in a direction perpendicular to the top flat face of the support layer;
   wherein the electrodes are arranged spaced apart from each other, such that extension planes, defined by the height and a longitudinal extension of each electrode, are arranged approximately parallel to each other, and each electrode has a height/width ratio of greater than one;
   wherein the support layer has a rectangular cross section and the top flat face and the bottom flat face of the support layer extend beyond the first planar semiconductor layer and the first and second electrodes;
   wherein the first planar semiconducting layer is made from a single dopant type;
   wherein, once the electrodes have been applied, the first planar semiconducting layer is arranged entirely and exclusively in a space between the first electrode and the second electrode with the bottom flat face of the first semiconducting layer applied directly onto the top flat face of the support layer and the first and second flat side faces of the first planar semiconducting layer applied directly against the first electrode and the second electrode;
   wherein, once the first planar semiconductor layer has been applied, the second planar semiconducting layer is arranged entirely and exclusively in a space between the first electrode and the second electrode with the bottom flat face of the second semiconducting layer applied directly onto the top flat face of the first planar semiconducting layer and the first and second flat side faces of the second planar semiconducting layer applied directly against the first electrode and the second electrode;
   wherein the height of the first and second electrodes is greater than the height of the first planar semiconducting layer and the second planar semiconducting layer;
   wherein the first and second electrodes are connected in an electrically conducting manner to the first planar semiconducting layer via the first and second full surface areas of the first and second flat side faces of the first planar semiconducting layer, respectively, so that the first full surface area of the first flat side face of the first planar semiconducting layer is entirely in contact with the first electrode and the second full surface area of the second flat side face of the first planar semiconducting layer is entirely in contact with the second electrode;
   wherein the first and second electrodes are connected in an electrically conducting manner to the second planar semiconducting layer via the first and second full surface areas of the first and second flat side faces of the second planar semiconducting layer, respectively, so that the first full surface area of the first flat side face of the second planar semiconducting layer is entirely in contact with the first electrode and the second full surface area of the second flat side face of the second planar semiconducting layer is entirely in contact with the second electrode;
   wherein the second planar semiconducting layer is of a different material from the semiconducting material of the first planar semiconducting layer;
   wherein in operation of the first planar semiconductor layer and the second planar semiconducting layer to produce current, the first electrode and the second electrode are not in the optical path of incident light to the first planar semiconducting layer and the second planar semiconducting layer;
   wherein the first electrode, the second electrode, the first planar semiconducting layer, and the second planar semiconducting layer are structurally distinct members of the layered structure;
   wherein the first electrode and the second electrode are made of an electrically conducting metal material, and the electrically conducting metal material is different from material of the first planar semiconducting layer and different from material of the second planar semiconducting layer; and
   wherein the first and second electrodes are each made from a different metal, and an electron work function of the metal of the first electrode is different from an electron work function of the metal of the second electrode.

2. The solar cell as claimed in claim 1, wherein the support layer and the first semiconducting layer are elastically deformable.

3. The solar cell as claimed in claim 1, wherein the support layer is made from a transparent material.

4. The solar cell as claimed in claim 1, wherein the support layer is made from an electrically non-conducting material.

5. The solar cell as claimed in claim 1, wherein the first semiconducting layer is made of semiconducting material selected from a group consisting of photoactive material, organic semiconducting material, and inorganic semiconducting material.

6. The solar cell of claim 5, wherein the photoactive material is designed to absorb light waves in the range of 500 nm to 650 nm.

7. The solar cell of claim 5, wherein the photoactive material is transparent or semi-transparent for light waves outside of the 500 nm to 650 nm range, which are absorbed.

8. The solar cell of claim 5,
wherein the second semiconducting layer is made from a photoactive material; and
wherein the photoactive material of the first semiconducting layer applied absorbs a different range within the spectrum of sunlight from the photoactive material of the second semiconducting layer.

9. The solar cell as claimed in claim 1, wherein the first and second electrodes are connected to one another in an electrically conducting manner.

10. The solar cell as claimed in claim 1, wherein the first and second electrodes are mutually interlocking finger electrodes.

11. The solar cell as claimed in claim 1, wherein the support layer is made from an electrically conducting material and an electrically isolating intermediate layer is applied to the top flat face of the support layer.

12. A solar cell for releasing charge carriers due to the effect of an electromagnetic wave, wherein the solar cell has a layered structure comprising:
a support layer having a top flat face and a bottom flat face;
a first electrode and a second electrode; and
a first planar semiconducting layer having a top flat face, a bottom flat face, and first and second flat side faces having first and second full surface areas, respectively, wherein the top flat face and the bottom flat face of the first planar semiconducting layer extend essentially parallel with one another and are spaced apart from one another by a height of the first planar semiconducting layer;
wherein the support layer forms a base for the installation of the first electrode and the second electrode applied by a structuring process directly on the top flat face of the support layer, the support layer carrying the first electrode and the second electrode;
wherein the first and second electrodes each have a rectangular cross section with a width and a height, such that only a flat face of the first and second electrodes corresponding to the width of the first and second electrodes is arranged directly onto the support layer;
wherein each height of the electrodes extends in a direction perpendicular to the top flat face of the support layer;
wherein the electrodes are arranged spaced apart from each other, such that extension planes, defined by the height and a longitudinal extension of each electrode, are arranged approximately parallel to each other, and each electrode has a height/width ratio of greater than one;
wherein the support layer has a rectangular cross section and the top flat face and the bottom flat face of the support layer extend beyond the first planar semiconductor layer and the first and second electrodes;
wherein the first planar semiconducting layer is made from a bulk-heterojunction type;
wherein, once the electrodes have been applied, the first planar semiconducting layer is arranged entirely and exclusively in a space between the first electrode and the second electrode with the bottom flat face of the first semiconducting layer applied directly onto the top flat face of the support layer and the first and second flat side faces of the first planar semiconducting layer applied directly against the first electrode and the second electrode;
wherein the height of the first and second electrodes is greater than the height of the first planar semiconducting layer;
wherein the first and second electrodes are connected in an electrically conducting manner to the first planar semiconducting layer via the first and second full surface areas of the first and second flat side faces of the first planar semiconducting layer, respectively, so that the first full surface area of the first flat side face of the first planar semiconducting layer is entirely in contact with the first electrode and the second full surface area of the second flat side face of the first planar semiconducting layer is entirely in contact with the second electrode;
wherein in operation of the first planar semiconducting layer to produce current, the first electrode and the second electrode are not in the optical path of incident light to the first planar semiconducting layer;
wherein the first electrode, the second electrode, and the first planar semiconducting layer are structurally distinct members of the layered structure;
wherein the first electrode and the second electrode are made of an electrically conducting metal material, and the electrically conducting metal material is different from material of the first planar semiconducting layer; and
wherein the first and second electrodes are each made from a different metal, and an electron work function of the metal of the first electrode is different from an electron work function of the metal of the second electrode.

13. A method of producing a solar cell comprising a layered structure, the method comprising steps of:
providing a support layer having a top flat face and a bottom flat face,
providing a first electrode directly on top of the top flat face of the support layer, the first electrode having a rectangular cross section with a width and a height, such that only a flat face of the first electrode corresponding to the width of the first electrode is arranged directly onto the support layer, a height of the first electrode extending in a direction perpendicular to the top flat face of the support layer, the first electrode having a height/width ratio of greater than one,
providing a second electrode directly on top of the top flat face of the support layer and spaced apart from the first electrode, such that extension planes, defined by the height and a longitudinal extension of each electrode, are arranged approximately parallel to each other, the second electrode having a rectangular cross section with a width and a height, such that only a flat face of the second electrode corresponding to the width of the second electrode is arranged directly onto the support layer, a height of the second electrode extending in a direction perpendicular to the top flat face of the support layer, the second electrode having a height/width ratio of greater than one, and providing a first planar semiconducting layer entirely and exclusively in a space between the first electrode and the second electrode such that:
- a bottom flat face of the first semiconducting layer is applied directly onto the top flat face of the support layer, and
- first and second flat side faces of the first planar semiconducting layer are applied directly against the first electrode and the second electrode such that the first and second electrodes are connected in an electrically conducting manner to the first planar semiconducting layer via first and second full surface areas of the first and second flat side faces, respectively, so that the first full surface area of the first flat side face is entirely in contact with the first electrode and the second full surface area of the second flat side face is entirely in contact with the second electrode, the first planar semiconductor layer having a top flat face extending essentially parallel to the bottom flat face of the first planar semiconductor layer and being spaced apart from the bottom flat face by a height of the first semiconductor layer, the first planar semiconductor layer being made from a bulk-heterojunction type, wherein the height of the first and second electrodes is greater than the height of the first planar semiconducting layer;

wherein the first electrode and the second electrode are not in the optical path of incident light to the first planar semiconducting layer, wherein the first electrode, the second electrode, and the first planar semiconducting layer are structurally distinct members of the layered structure, wherein the first electrode and the second electrode are made of an electrically conducting metal material, and the electrically conducting metal material is different from material of the first planar semiconducting layer, and wherein the first and second electrodes are each made from a different metal, and an electron work function of the metal of the first electrode is different from an electron work function of the metal of the second electrode.

14. The method of claim 13, wherein the first and second electrodes are disposed in an alternating arrangement and spaced at a distance apart from one another.

15. The method of claim 13, wherein the first and second electrodes are applied to the support layer via lithography, screen printing, inkjet, nano-imprint, stamping, or laser ablation.

16. The method of claim 13, wherein the first and second electrodes are applied in the form of interlocking finger electrodes.

17. The method of claim 13, wherein a method of applying the first planar semiconducting layer comprises vapor deposition.

18. The method of claim 13, wherein the first planar semiconducting layer is provided using a method selected from the group consisting of inkjet printing, screen printing, and laser ablation.

19. The method of claim 13, wherein an electric field of at least $10^{-5}$ V/cm is applied while the first planar semiconducting layer is being applied.

20. The method of claim 13, wherein the first planar semiconducting layer comprises material combinations selected from the group consisting of polymers, carbon nano-tubes, small molecules, dendrimers, quantum dots, inorganic nano-particles and mixtures thereof.

21. The method of claim 13, wherein at least one other layer is applied to a top flat face of the first planar semiconducting layer.

* * * * *